US011145512B2

(12) United States Patent
Hsieh et al.

(10) Patent No.: US 11,145,512 B2
(45) Date of Patent: Oct. 12, 2021

(54) GATE ISOLATION PLUGS STRUCTURE AND METHOD

(71) Applicant: Taiwan Semiconductor Manufacturing Company, Ltd., Hsinchu (TW)

(72) Inventors: Wen-Shuo Hsieh, Taipei (TW); Shih-Chang Tsai, Hsinchu (TW); Chih-Han Lin, Hsinchu (TW); Te-Yung Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/872,814

(22) Filed: May 12, 2020

(65) Prior Publication Data

US 2020/0273709 A1 Aug. 27, 2020

Related U.S. Application Data

(60) Continuation of application No. 16/229,908, filed on Dec. 21, 2018, now Pat. No. 10,692,723, which is a division of application No. 15/798,742, filed on Oct. 31, 2017, now Pat. No. 10,163,640.

(51) Int. Cl.
*H01L 29/66* (2006.01)
*H01L 29/78* (2006.01)
*H01L 21/28* (2006.01)
*H01L 21/8234* (2006.01)
*H01L 21/8238* (2006.01)

(52) U.S. Cl.
CPC ............ *H01L 21/28123* (2013.01); *H01L 21/823431* (2013.01); *H01L 21/823437* (2013.01); *H01L 21/823481* (2013.01); *H01L 29/66545* (2013.01); *H01L 29/66553* (2013.01); *H01L 29/66795* (2013.01); *H01L 29/785* (2013.01); *H01L 21/823842* (2013.01)

(58) Field of Classification Search
CPC ......... H01L 21/28123; H01L 29/66795; H01L 29/785
See application file for complete search history.

(56) References Cited

U.S. PATENT DOCUMENTS

| 8,487,378 B2 | 7/2013 | Soto et al. |
| 8,729,634 B2 | 5/2014 | Shen et al. |
| 8,826,213 B1 | 9/2014 | Ho et al. |
| 8,887,106 B2 | 11/2014 | Ho et al. |

(Continued)

FOREIGN PATENT DOCUMENTS

| CN | 102332431 A | 1/2012 |
| CN | 103456775 A | 12/2013 |

(Continued)

*Primary Examiner* — Daniel P Shook
(74) *Attorney, Agent, or Firm* — Slater Matsil, LLP

(57) ABSTRACT

A method of forming a gate isolation plug for FinFETs includes forming an elongated gate, forming first and second spacers in contact with first and second sidewalls of the elongated gate, separating the elongated gate into first and second gate portions using first and second etching steps, and forming a gate isolation plug between the first and second gate portions, wherein a length of the gate isolation plug is greater than a length of either of the first or second gate portions.

20 Claims, 9 Drawing Sheets

(56) References Cited

U.S. PATENT DOCUMENTS

| | | |
|---|---|---|
| 9,704,754 B1 | 7/2017 | Bao et al. |
| 2014/0252486 A1 | 9/2014 | Lin et al. |
| 2014/0282326 A1 | 9/2014 | Chen et al. |
| 2016/0133632 A1* | 5/2016 | Park ............... H01L 21/845 257/369 |
| 2017/0040328 A1 | 2/2017 | Park et al. |
| 2017/0222055 A1 | 8/2017 | Chang et al. |

FOREIGN PATENT DOCUMENTS

| | | |
|---|---|---|
| CN | 105006483 A | 10/2015 |
| KR | 1020140111577 A | 9/2014 |
| KR | 1020160056693 A | 5/2016 |

\* cited by examiner

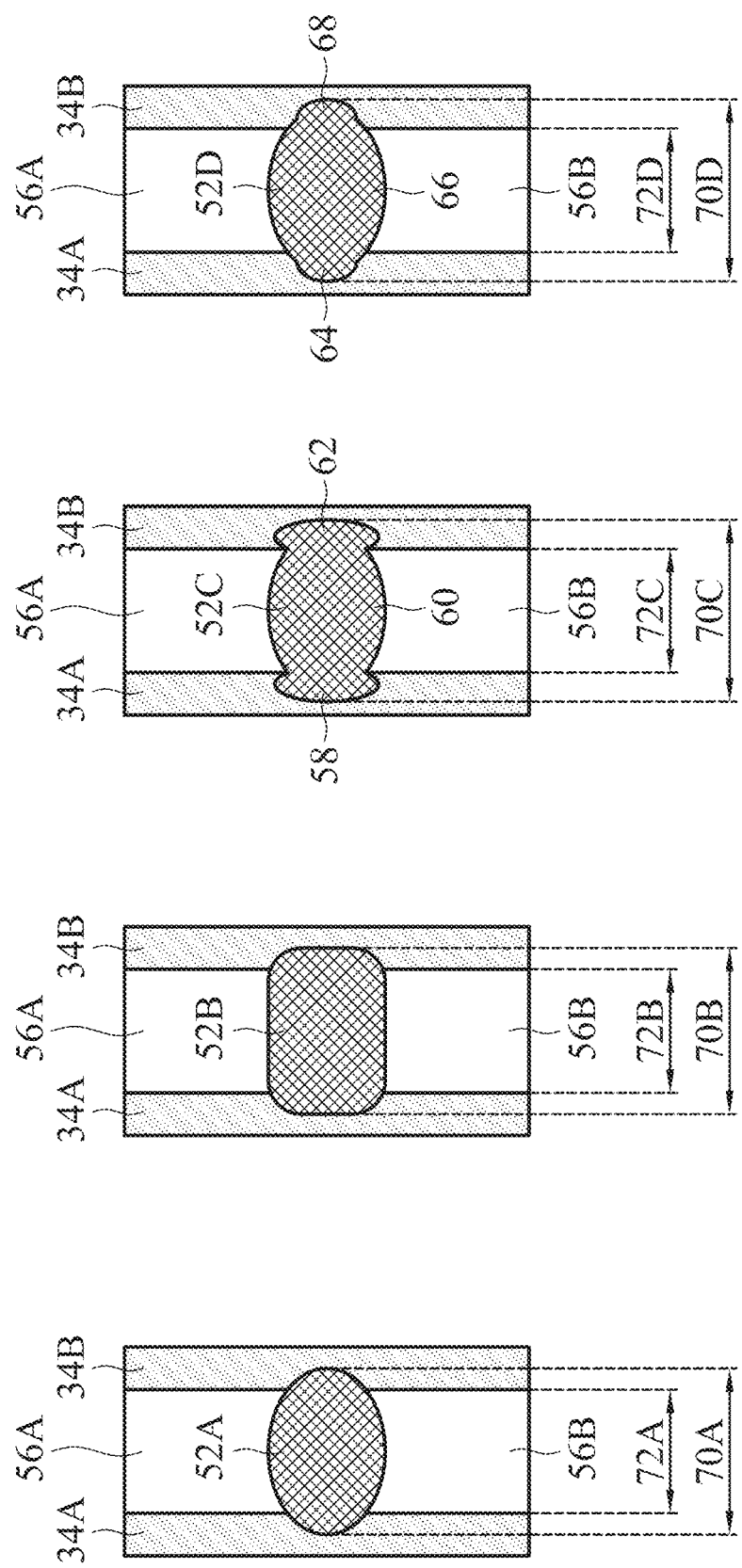

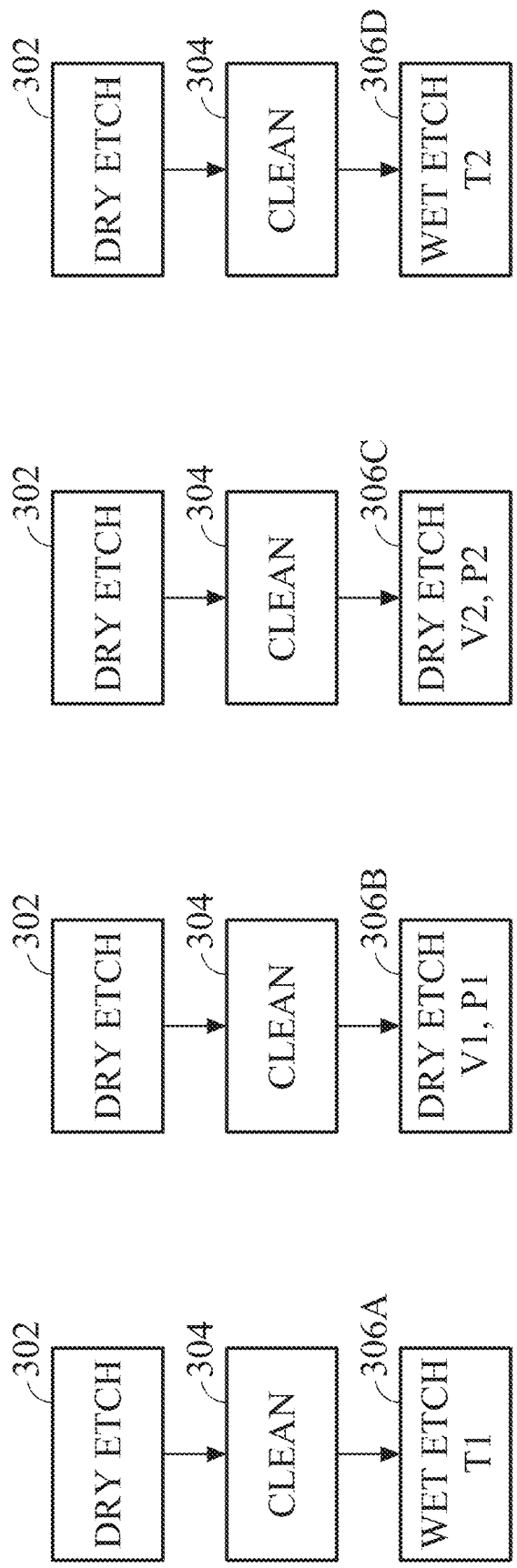

GATE ISOLATION PLUGS STRUCTURE AND METHOD

PRIORITY CLAIM AND CROSS-REFERENCE

This application is a continuation of U.S. patent application Ser. No. 16/229,908, entitled "Gate Isolation Plugs Structure and Method", filed Dec. 21, 2018, which application is a divisional of U.S. patent application Ser. No. 15/798,742, entitled "Gate Isolation Plugs Structure and Method," filed on Oct. 31, 2017, now U.S. Pat. No. 10,163,640, which applications are incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that the portions of the long dummy gate are separated from each other. A dielectric material is then filled into the opening left by the etched portion of the long dummy gate. The dielectric material is then polished, leaving a portion of the dielectric material between the remaining portions of the dummy gate. The separated portions of the dummy gate are then replaced with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 6D illustrate cross-sectional views, top views, and perspective views of intermediate stages in the formation of Fin Field-Effect Transistors (FinFETs) and a gate isolation plug in accordance with some embodiments.

FIGS. 7A through 8 illustrate process flows for forming the gate isolation plug in accordance with some embodiments.

DETAILED DESCRIPTION

Figure 1A:
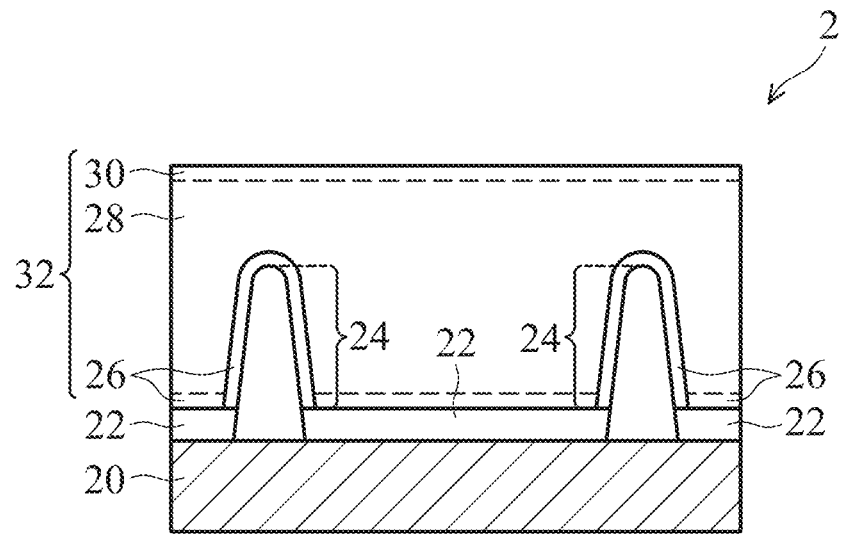

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A gate isolation structure and the method of forming the same are provided in accordance with various exemplary embodiments. The intermediate stages of forming the gate isolation structure are illustrated in accordance with some embodiments. Some variations of some embodiments are discussed. Throughout the various views and illustrative embodiments, like reference numbers are used to designate like elements.

FIGS. 1A through 6D illustrate the cross-sectional views, the top views, and the perspective views of intermediate stages in the formation of Fin Field-Effect Transistors and a gate isolation structure in accordance with some embodiments. The intermediate stages shown in FIGS. 1A through 6D are also illustrated schematically in the process flows shown in FIGS. 7A through 7D and in FIG. 8.

FIG. 1A illustrates the initial steps and the resulting structure in accordance with some embodiments. Substrate 20, which is a portion of semiconductor wafer 2, is provided. Substrate 20 may be a semiconductor substrate such as a silicon substrate, and other materials such as silicon germanium, silicon carbon, and the like, may be used. Substrate 20 may also be a bulk semiconductor substrate or a silicon-on-insulator substrate.

Isolation regions 22 are formed to extend into substrate 20, in an embodiment, although this might not be the case if other methods are used in the fabrication of semiconductor fins 24. Isolation regions 22 may be, for example, Shallow Trench Isolation (STI) regions. The formation of STI regions 22 may include etching semiconductor substrate 20 to form trenches (not shown), and filling the trenches with a dielectric material to form STI regions 22. STI regions 22 may be formed of silicon oxide, although other dielectric materials such as nitrides may also be used.

Semiconductor fins 24 protrude out of the top surfaces of STI region 22, and overlap the underlying semiconductor strips, which are portions of semiconductor substrate 20 between STI regions 22. The formation of semiconductor fins 24 may include forming STI regions 22 to have top surfaces level with the top surfaces of semiconductor fins 24, and recessing STI regions 22. The portions of semiconductor material between the removed portions of STI regions 22 thus become semiconductor fins 24. Semiconductor fins 24 and some or substantially entireties of semiconductor strips may be formed of silicon or other silicon-containing compounds including, and not limited to, silicon carbon, silicon germanium, or the like.

Dummy gate stack 32 is formed over STI regions 22 and semiconductor fins 24. The respective step is illustrated as step 202 in the process flow 200 shown in FIG. 8. Dummy gate stack 32 includes gate dielectric 26 and dummy gate electrode 28 over gate dielectric 26. The portions of gate dielectric 26 underlying dummy gate electrode 28 may be removed in later steps, and hence gate dielectric 26 is a dummy gate dielectric in accordance with these embodiments. The portions of gate dielectric 26 underlying dummy gate electrode 28 may also be left in the final device in accordance with some embodiments, and hence gate dielectric 26 act as the gate dielectrics of the resulting FinFETs. In accordance with some embodiments of the present disclosure, gate dielectric 26 includes silicon oxide. In accordance with alternative embodiments, other materials such as silicon nitride, silicon carbide, or the like, can also be used to form gate dielectric 26. Gate dielectric 26 may be formed by oxidizing semiconductor fins 24, and hence gate dielectric 26 is formed conformally on semiconductor fins 24, as shown in FIG. 1A. In accordance with alternative embodiments, gate dielectric 26 is formed through deposition, and hence will include horizontal portions on the top surfaces of STI regions 22 in addition to the illustrated portions. The respective horizontal portions of gate dielectric 26 are illustrated using dashed lines.

Dummy gate electrode 28 may include polysilicon. In accordance with some embodiments, dummy gate stack 32 further includes hard mask 30 over dummy gate electrode 28. Hard mask 30 may be formed of silicon nitride, for example, while other materials such as silicon carbide, silicon oxynitride, or the like may also be used. In accordance with alternative embodiments, hard mask 30 is not formed. Accordingly, hard mask 30 is illustrated in FIG. 1A using a dashed line.

Figure 1B:
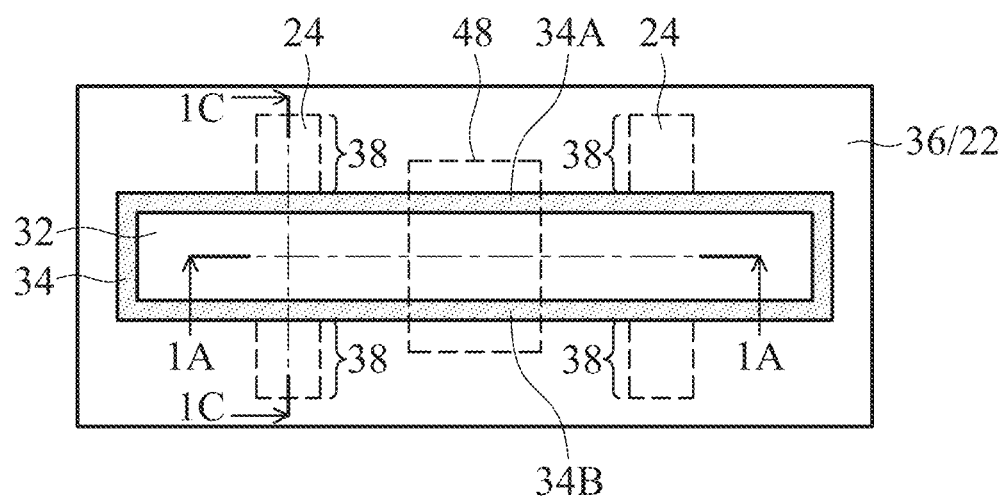

As shown in FIG. 1A, dummy gate stack 32 crosses over a plurality of semiconductor fins 24. FIG. 1B illustrates a top view of dummy gate stack 32 in accordance with some embodiments, wherein the cross-sectional view shown in FIG. 1A is obtained from the plane containing line 1A-1A in FIG. 1B, hereinafter referred to as being in the direction of the gate. It is appreciated that although FIGS. 1A and 1B illustrate that dummy gate stack 32 crosses over two semiconductor fins 24 for the simplicity of illustration, dummy gate stack 32 may cross over (and extends on the sidewalls of) three, four, or any greater number of semiconductor fins.

Referring to FIG. 1B, gate spacer 34 is formed on the sidewalls of dummy gate stack 32. Gate spacer 34 may form a ring encircling dummy gate stack 32. Gate spacer 34 may be formed of oxides, nitrides, oxynitrides, carbides, or the like. In particular, spacer 34 can be formed from SiN, SiON, SiOCN, SiC, or SiOC, or other such materials in embodiments. Spacer 34 can have a thickness from about 5 to 500 Angstroms. In accordance with some exemplary embodiments, gate spacer 34 includes a silicon oxide layer and a silicon nitride layer over the silicon oxide layer, wherein the silicon oxide layer may have an L-shape in a cross-sectional view, with the silicon nitride layer on the horizontal leg of the silicon nitride layer.

Further referring to FIG. 1B, Inter-Layer Dielectric (ILD) 36 surrounds dummy gate stack 32 and gate spacer 34. Also illustrated in FIG. 1B is device area 48 generally corresponding to a patterned hard mask 30 area described in further detail below, which includes gate spacer portions 34A and 34B.

Figure 1C:
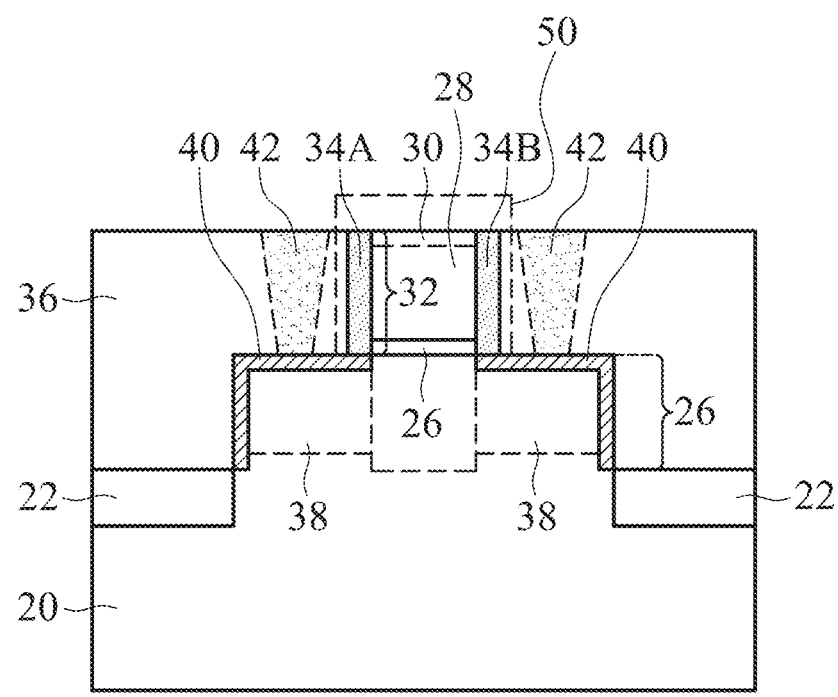

FIG. 1C illustrates a cross-sectional view of the structure shown in FIG. 1B, wherein the cross-sectional view is obtained from the plane containing line 1C-1C in FIG. 1B, hereinafter referred to as being across the gate direction. The top surface of ILD 36 is coplanar with the top surface of dummy gate stack 32 and the top surface of gate spacer 34. ILD 36 may be blanket formed to a height higher than the top surface of dummy gate stack 32, followed by a planarization (such as a Chemical Mechanical Polish (CMP)) to remove excess portions of ILD 36, wherein the excess portions are higher than the top surfaces of dummy gate stack 32 and gate spacer 34. ILD 36 may comprise a flowable oxide formed using, for example, Flowable Chemical Vapor Deposition (FCVD). ILD 36 may also be a spin-on glass formed using spin-on coating. ILD 36 may also be formed of Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or another low-k non-porous dielectric material.

In accordance with some embodiments, as shown in FIG. 1C, source and drain regions (referred to as source/drain regions hereinafter) 38 are formed in the opposite end portions of semiconductor fins 24 not covered by dummy gate stack 32. Source/drain regions 38 may be formed by implanting the end portions of semiconductor fins 24, or by recessing the end portions of semiconductor fins 24 to form recesses, followed by re-growing source/drain regions in the recesses. Source/drain silicide regions 40 may be formed on the surfaces of source/drain regions 38. Source/drain contact plugs 42 may be formed to extend into ILD 36 in order to electrically connect to source/drain regions 38. Source/drain contact plugs 42 may be formed of tungsten or other conductive materials/metals. In accordance with alternative embodiments, source/drain silicide regions 40 and contact plugs 42, rather than being formed at this stage, are formed in later stages. Similarly, source/drain contact plugs 42 may also be formed either in the initial steps or in later stages, and hence source/drain contact plugs 42 are shown using dashed lines.

FIG. 1C also illustrates a device portion 50, which in pertinent part includes a portion of the ILD layer 36, gate spacers 34, and the dummy gate stack 32. FIGS. 1A through 1C thus show three different views of a device in preparation for forming a gate isolation plug according to embodiments. In particular, FIGS. 1A through 1C illustrate details, including individual features between process steps 202 and 204 shown in FIG. 8. FIG. 1B shows the plan view of dummy gate stack 32 with associated gate spacers 34A and 34B, including device area 48. FIG. 1A shows a cross-sectional view of the device along the gate direction of dummy gate stack 32, optional hard mask 30, semiconductor fins 24, and isolation region 22. FIG. 1C shows a cross-sectional view of the device across the gate direction illustrating isolation region 22, separated inter-layer dielectric layer 36, spacers 34A and 34B, dummy gate stack 32, and optional hard mask 30.

Figure 2A:
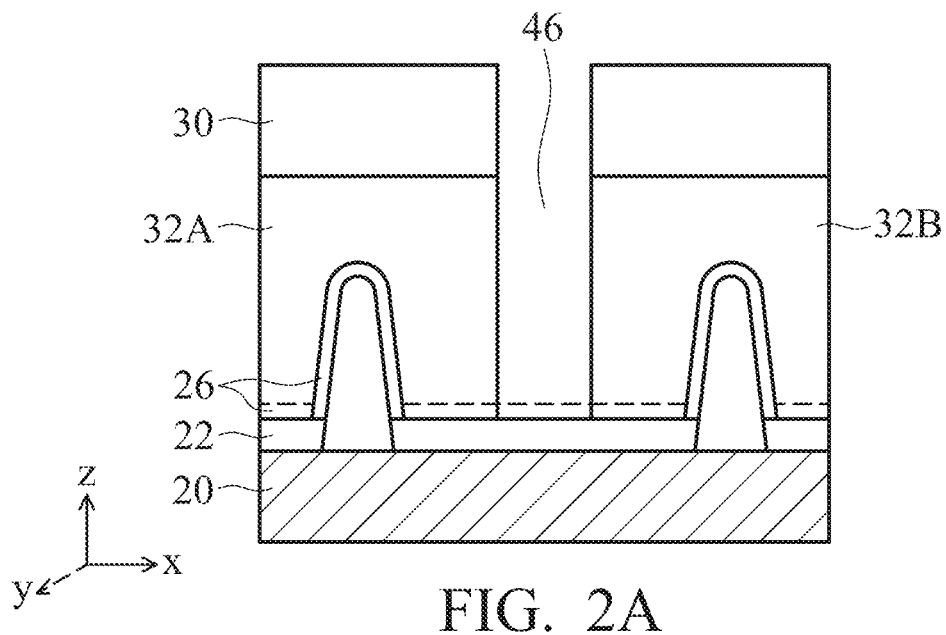
Figure 2B:
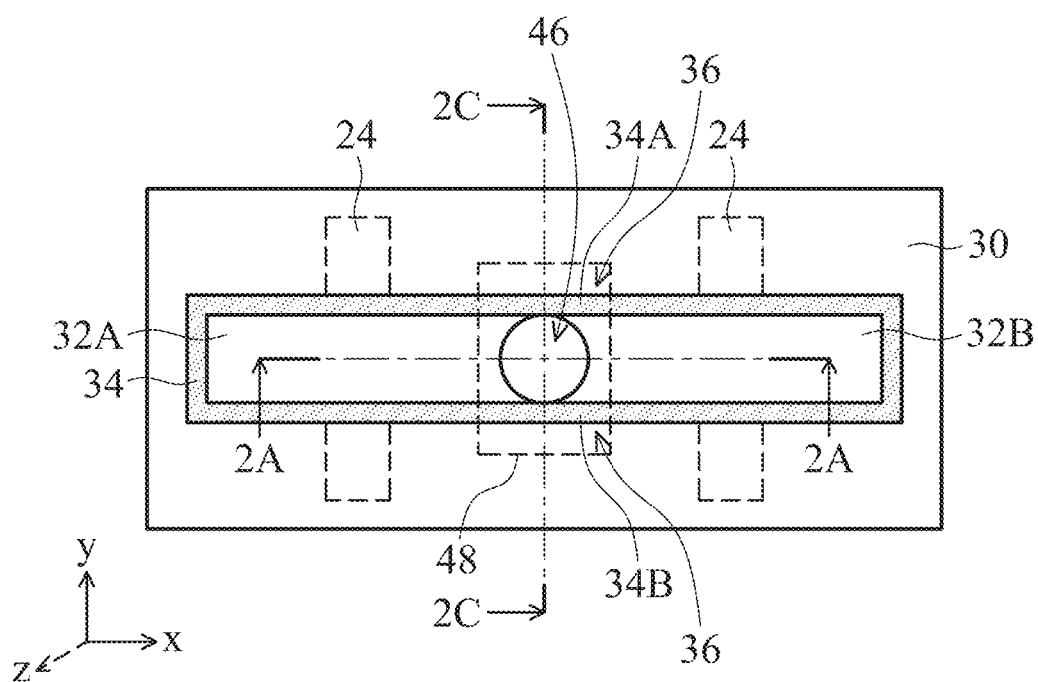

Referring to FIG. 2A, hard mask 30 is patterned. FIG. 2B illustrates a top view of the structure shown in FIG. 2A. As shown in FIG. 2B, hard mask 30 covers the end portions of dummy gate stack 32, while leaving a center portion of dummy gate stack 32 not covered. Dummy gate stack 32 is then etched through the opening in hard mask 30. The respective step is illustrated as step 204 in the process flow shown in FIG. 8. As a result, as shown in FIGS. 2A and 2B, a center portion of dummy gate stack 32 is removed. The long dummy gate stack 32 is thus cut into two discrete portions that are disconnected from each other in accordance with some exemplary embodiments. The remaining portions are referred to as dummy gate stacks 32A and 32B. In the embodiments wherein dummy gate stack 32 in FIG. 1B crosses over three, four, or more semiconductor fins 24, dummy gate stack 32 may be cut into three, four, or more discrete portions. Furthermore, each discrete portion of dummy date stack 32 may cross over one, two, or more semiconductor fins 24 in order to form single-fin FinFETs or multi-fin FinFETs.

As a result of the etching of dummy gate stack 32, opening 46 is formed between dummy gate stacks 32A and 32B. Furthermore, opening 46 is formed between gate spacer portions 34A and 34B, which are the parallel opposite portions of gate spacer 34. Each of gate spacer portions 34A and 34B has a sidewall exposed to opening 46. As shown in FIG. 2A, when dummy gate dielectric 26 has the horizontal portion as shown by dashed line, the exposed horizontal portion may be exposed to opening 46. Furthermore, the exposed horizontal portion of gate dielectric 26 may be removed during the etching of dummy gate stack 32, or may remain (and thinned) during the etching of dummy gate stack 32.

Figure 2C:
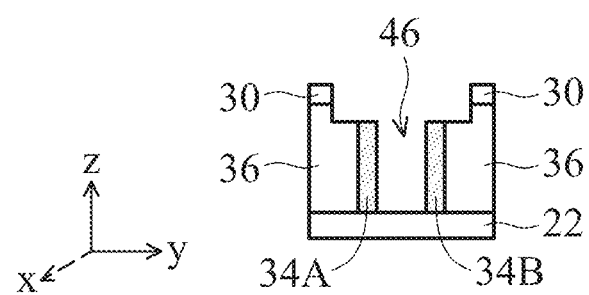

FIGS. 2A through 2C thus show three views of the device during a first etching step for forming a gate isolation plug according to embodiments. As previously discussed with respect to FIGS. 1A through 1C, FIG. 2B illustrates a top view of the same device portion after the first etching step that is discussed in further detail below, wherein a cross-sectional view of the device portion shown in FIG. 2A is obtained from the plane containing line 2A-2A in FIG. 2B, previously referred to as being in the direction of the gate, and wherein FIG. 2C illustrates a cross-sectional view of the device portion obtained from the plane containing line 2C-2C in FIG. 2B, previously referred to as being across the gate direction. "X", "Y", and "Z" axes are shown in FIGS. 2A, 2B, and 2C, wherein the axis that extends out from the surface of the drawing is shown as a dashed line.

Figure 8:
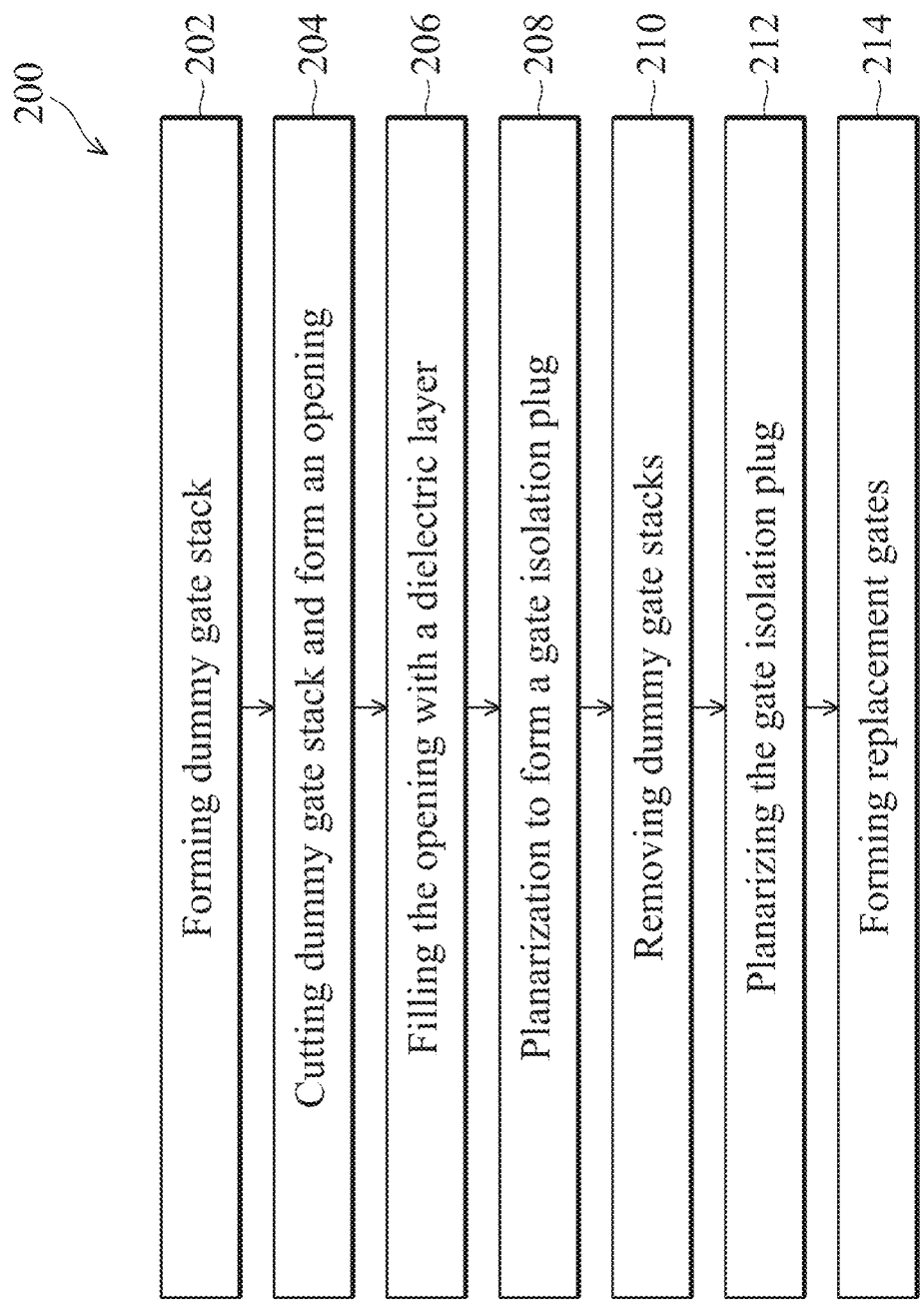

In particular, FIGS. 2A through 2C illustrate the device during a first etching step portion of process step 204 shown in FIG. 8. FIG. 2B shows the plan view of dummy gate stack 32 separated at location 46 into dummy gate stack portions 32A and 32B by a first etching step using the hard mask (not shown in FIG. 2B). FIG. 2A shows a cross-sectional view of the device along the gate direction of dummy gate stack 32 separated at location 46 into dummy gate stack portions 32A and 32B by a first etching step using the hard mask 30. FIG. 2C shows a cross-sectional view of device area 50 across the gate direction illustrating the removal of the dummy gate stack 32 at location 46 using the first etching step.

According to embodiments, the etching of dummy gate stack 32 to form opening 46 between dummy gate stacks 32A and 32B is further explained below with reference to FIGS. 3A through 5C. In particular subsequent processing steps and structures and individual features associated with the cross-sectional view of FIG. 1A, device area 48 (shown in the plan view of FIG. 1B) and device area 50 (shown in the cross-sectional view of FIG. 1C) are illustrated and described below in further detail. FIGS. 6A through 6D illustrate various shaped gate isolation plugs according to embodiments that are placed into the opening 46 between dummy gate stacks 32A and 32B.

Figure 3A:
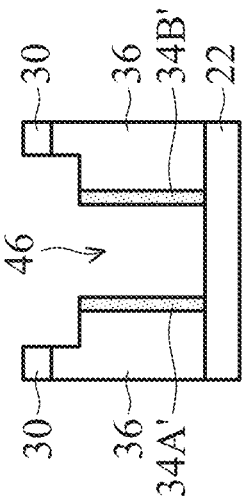
Figure 3B:
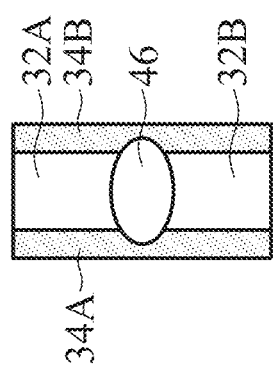
Figure 3C:
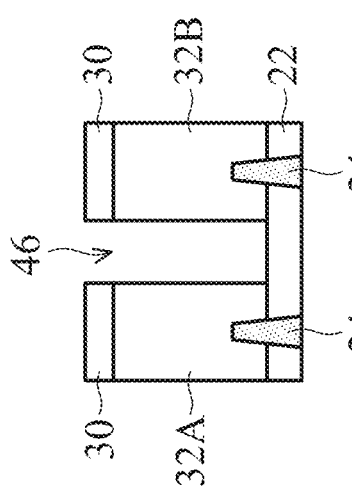

FIGS. 3A through 3C show three views of the device during a second etching step for forming a gate isolation plug according to embodiments. In particular, FIGS. 3A through 3C illustrate the device during a second etching step portion of process step 204 shown in FIG. 8. FIG. 3B shows a plan view of device area 48 illustrating the opening at location 46 being enlarged and extending into spacers 34A and 34B using a second etching step according to embodiments. FIG. 3A shows a cross-sectional view of the device along the gate direction illustrating the continued separation of gate stack portions 32A and 32B at location 46 using a second etching step using the hard mask 30. FIG. 3C shows a reduction in the size of spacers 34A and 34B resulting in reduced size spacers 34A' and 34B' using the second etching step. The first etching step uses a dry etch, and the second etching step can be either a dry or a wet etching step. Further details of the first and second etching steps are described below in conjunction with various shapes and dimensions of the corresponding gate isolation plugs that can be formed according to embodiments.

Figure 4A:
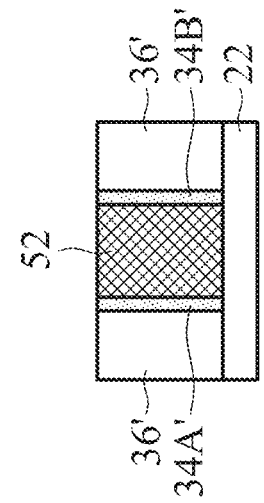
Figure 4B:
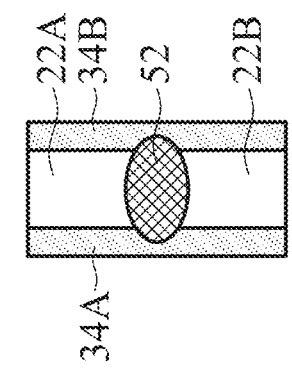
Figure 4C:
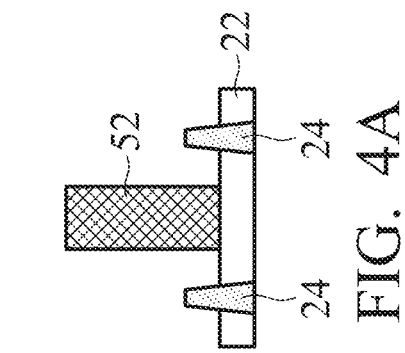

FIGS. 4A through 4C show three views of the device during the gate isolation plug formation and removal of the dummy gate according to embodiments. In particular, FIGS. 4A through 4C illustrate the device during process steps 206, 208, and 210 shown in FIG. 8. FIG. 4B shows a plan view of device area 48 illustrating the deposition of a dielectric gate isolation plug 52, chemical mechanical polishing, and subsequent removal of the dummy gate stack portions at isolation locations 22A and 22B. FIG. 4A shows a cross-sectional view of the device along the gate direction illustrating the deposition of a dielectric gate isolation plug 52, and removal of the dummy gate stacks. FIG. 4C shows a cross-sectional view of device area 50 across the gate direction illustrating the deposition of the dielectric gate isolation plug 52, and the results of the chemical mechanical polishing step.

The dielectric material used in gate isolation plug 52 can be SiN, SiON, SiCON, SiC, SiOC, SiO2, SiC, and other such materials. Gate isolation plug 52 can have a thickness of about 5 to 200 Angstroms.

Figure 5A:
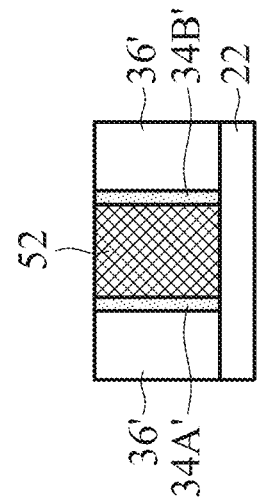
Figure 5B:
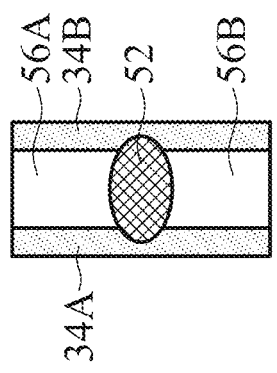
Figure 5C:
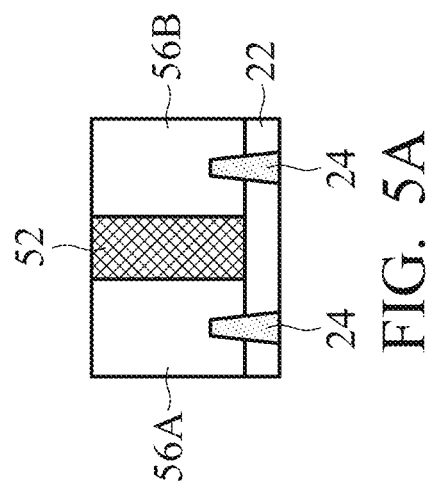

FIGS. 5A through 5C show three views of the device during the formation of the metal replacement gate according to embodiments. In particular, FIGS. 5A through 5C illustrate the device during process step 214 shown in FIG. 8. FIG. 5B shows a plan view of device area 48 illustrating the formation of the metal gate portions 56A and 56B, which are separated by gate isolation plug 52. FIG. 5A shows a cross-sectional view of the device along the gate direction illustrating the formation of the metal gate portions 56A and 56B, which are separated by gate isolation plug 52. FIG. 5C shows a cross-sectional view of device area 50 across the gate direction illustrating the cross-sectional view after the metal gate is formed. Since the metal gate is not visible in FIG. 5C, FIGS. 4C and 5C are substantially the same.

Metal gate portions 56A and 56B can be formed from tungsten (W), Al, Cu, AlCu, Ti, TiAlN, TaC, TaCN, TaSiN, Mn, Zr, TiN, Ta, TaN, Co, Ni, and other metals and metal alloys. Metal gate portions can have a thickness from about 5 to 5000 Angstroms.

FIGS. 6A through 6D illustrate four plan views of device area 48 including first and second metal gate portions 56A and 56B, associated gate spacers 34A and 34B, and corresponding gate isolation plugs 52A, 52B, 52C, and 52D. The shape, dimensions, and method of forming each of the gate isolation plugs is described in further detail below.

FIG. 6A corresponds generally to previous FIG. 5B, but is reproduced to illustrate a contrast with three other gate isolation shapes, and includes dimensions of the metal gate length and the gate isolation plug length. FIG. 6A shows a plan view of device area 48 including metal gate portions 56A and 56B, spacers 34A and 34B, and a dielectric gate isolation plug 52A. In an embodiment, gate isolation plug 52A has an oval or football shape. The first and second etching steps for producing the oval shaped gate isolation plug 52A are described immediately below. Note that a plug length 70A is greater than a metal gate length 72A, and that the gate isolation plug 52A extends into spacers 34A and 34B. The plug length 70A and metal gate length 72A are defined in the same direction as is shown in FIG. 6A though 6D. In an embodiment, the metal gate length 72A is on the order of 7 nm, but other gate lengths such as 14 nm, 16 nm, 20 nm, and 45 nm can also be used, as well as other gate lengths desired for a particular application. In an embodiment a difference between plug length 70A and metal gate length 72A is greater than three Angstroms. Thus, in an embodiment the metal gate length 72A is on the order of 7 nm (70 Angstroms) and the plug length 70A is greater than 7.3 nm (73 Angstroms).

In the first etching step a dry etch is used to remove a portion of the silicon dummy gate as previously described. The dry chemistry in the first etching step uses F, Cl, or HBr dry etch with high Si to SiN selectivity (Si etching only) and a very high bias voltage (vertical etching) of 500 to 1500 volts and a pressure of 20 to 100 mTorr (or other suitable working pressure). The length of the dry etch is about 30 minutes to 200 minutes, which is time dependent on the voltage and pressure used. The first etching step is followed by a cleaning step using dilute HF (10-90%) at a temperature range of about 50° C. to 100° C. for about 20 to 120 minutes. The time of the cleaning step is dependent on the concentration and temperature used.

The second etching step is a wet etching step and is used to pull back the SiN of the gate spacers, in an embodiment. The wet chemistry of the second etching step uses a wet etching process ($H_3PO_4$) to pull back the SiN, which has a high SiN to Si selectivity (SiN etching only). $H_3PO_4$ is used at a temperature of about 50° C. to 100° C. An etching time of about 10 to 35 minutes is used. The etching time of the second etching step is dependent of the temperature used.

FIG. 6B shows a plan view of device area 48 including metal gate portions 56A and 56B, spacers 34A and 34B, and a dielectric gate isolation plug 52B. In an embodiment, gate isolation plug 52B has a square shape, with rounded corners. The first and second etching steps for producing the square shaped gate isolation plug 52B are described immediately below. Note that a plug length 70B is greater than a metal gate length 72B, and that the gate isolation plug 52B extends into spacers 34A and 34B. In an embodiment a difference between plug length 70B and metal gate length 72B is greater than three Angstroms. In an embodiment, the outer dimension of gate isolation plug 72B is at least 73 Angstroms in length, as previously discussed.

The first etching step and corresponding cleaning step for gate isolation plug 52B are the same as described above with respect to gate isolation plug 52A shown in FIG. 6A.

The second etching step is a dry etching step. The dry chemistry of the second etching step uses a dry etching process ($CH_3F$ or $CHF_3$) with a high bias voltage of 500 to 1400 volts and a low pressure of about 5 to 60 mTorr. An etching time of between 7 to 55 minutes is used, which is dependent upon pressure, chemistry, and bias voltage used.

FIG. 6C shows a plan view of device area 48 including metal gate portions 56A and 56B, spacers 34A and 34B, and a dielectric gate isolation plug 52C. In an embodiment, gate isolation plug 52C has a deformed square shape having a regular central portion 60, and first and second irregular end portions 58 and 62, respectively. The first and second etching steps for producing gate isolation plug 52C are described immediately below. Note that a plug length 70C is greater than a metal gate length 72C, and that the gate isolation plug 52C extends into spacers 34A and 34B. In an embodiment a difference between plug length 70C and metal gate length 72C is greater than three Angstroms. In an embodiment, the outer dimension of gate isolation plug 52C is at least 73 Angstroms in length, as previously discussed.

The first etching step and corresponding cleaning step for gate isolation plug 52C are the same as described above with respect to gate isolation plug 52A shown in FIG. 6A.

The second etching step is a dry etching step. The dry chemistry of the dry etching step uses $CH_3F$ or $CHF_3$ with a low bias voltage of 100 to 200 volts and a high pressure of 80 to 160 mTorr. An etching time of 14 minutes to 100 minutes is used, with the time being dependent upon pressure, chemistry, and bias voltage used.

FIG. 6D shows a plan view of device area 48 including metal gate portions 56A and 56B, spacers 34A and 34B, and a dielectric gate isolation plug 52D. In an embodiment, gate isolation plug 52D has a lemon shape, with a generally oval center portion 66 and two end portions 64 and 68. The first and second etching steps for producing the lemon shaped gate isolation plug 52D are described immediately below. Note that a plug length 70D is greater than a metal gate length 72D, and that the gate isolation plug 52D extends into spacers 34A and 34B. In an embodiment a difference between plug length 70D and metal gate length 72D is greater than three Angstroms. In an embodiment, the outer dimension of gate isolation plug 52D is at least 73 Angstroms in length as previously discussed.

The first etching step and corresponding cleaning step for gate isolation plug 52D are the same as described above with respect to gate isolation plug 52A shown in FIG. 6A.

The second etching step is a wet etching step. The wet etching step uses $H_3PO_4$ to pull back the SiN spacers previously described, which has a high SiN to Si selectivity (SiN etching only). $H_3PO_4$ is used at a temperature of between 50° C. to 100° C. An etching time of between 35 and 90 minutes is used, which is dependent upon the temperature used in the second etching step.

FIGS. 7A through 7D summarize the first and second etching steps, as well as a cleaning step, used in separating the first and second dummy gate portions, and later metal gate portions, into which a gate isolation plug is formed. The first and second etching steps and the cleaning step all occur within the cutting dummy gate stack and form an opening step 204 shown in FIG. 8, which is summarized below. FIG. 7A illustrates an embodiment method associated with oval shaped gate isolation plug 52A including a dry etch step 302, a cleaning step 304, and a wet etch step 306A performed for a first time period T1. FIG. 7B illustrates an embodiment method associated with square shaped gate isolation plug 52B including a dry etch step 302, a cleaning step 304, and a dry etch step 306B performed at a first bias voltage V1 and a first pressure P1. FIG. 7C illustrates an embodiment method associated with deformed square shaped gate isolation plug 52C including a dry etch step 302, a cleaning step 304, and a dry etch step 306C performed at a second bias voltage V2 and a second pressure P2. FIG. 7D illustrates an embodiment method associated with lemon shaped gate isolation plug 52D including a dry etch step 302, a cleaning step 304, and a wet etch step 306D performed for a second time period T2. In embodiments time periods T1 and T2 are different time periods, bias voltages V1 and V2 are different voltages, and pressures P1 and P2 are different pressures.

FIG. 8 summarizes the method steps according to an embodiment method 200 for forming a FinFET using the gate isolation plug previously described. A dummy gate stack is formed at step 202, and the dummy gate stack is cut and an opening formed at step 204. The opening is filled with a dielectric layer at step 206, and planarized to form the gate isolation plug at step 208. The dummy gate stack is removed at step 210, and planarized at step 212. The replacement gate, such as a metal gate, is formed at step 214.

It is appreciated that although FinFETs are used herein as an example, the concept of the present disclosure can also be used on planar transistors. The structure and the formation methods of the planar transistors and the corresponding gate isolation plugs are similar to what are shown and described, except that planar active regions rather than semiconductor fins are used.

The embodiments of the present disclosure have some advantageous features. Referring to FIGS. 6A through 6D, any of gate isolation plugs 52A through 52D can be used to reduce or substantially eliminate leakage current between metal gate portions 56A and 56B associated with different electrically isolated FinFETS. Gate isolation plugs 52A through 52D.

In an embodiment, a method includes forming an elongated gate, forming first and second spacers in contact with first and second sidewalls of the elongated gate, separating the elongated gate into first and second gate portions using first and second etching steps, and forming a gate isolation plug between the first and second gate portions, wherein a length of the gate isolation plug is greater than a length of either of the first or second gate portions. A difference between the length of the isolation plug and the length of either of the first and second gate portions is at least three Angstroms. In embodiments, the gate isolation plug can include an oval shape, a square shape, or a lemon shape, and can also include a regular central portion and first and second irregular end portions. The first and second gate portions can include metal gate portions, or dummy gate portions. The first and second spacers can include dielectric spacers and the gate isolation plug can include a dielectric gate isolation plug.

In another embodiment, a method includes forming an elongated gate including a first length, forming first and second spacers in contact with the elongated gate, etching the elongated gate to form a first opening, wherein the first opening separates the elongated dummy gate stack into a first gate portion and a second gate portion, etching the elongated gate to form a second opening larger than the first opening, including a second length greater than the first length, and depositing a dielectric layer into the second opening. Etching the elongated gate to form a first opening can include a dry etching method. Etching the elongated gate to form a second opening can include a wet etching method or a dry etching method. A difference between the second length and the first length is at least three Angstroms.

In another embodiment, a device includes an elongated gate including a first length, a gate isolation plug dividing the elongated gate into a first gate portion and a second gate portion, wherein the gate isolation plug includes a second length greater than the first length, a first Fin Field-Effect Transistor (FinFET) including a first semiconductor fin, wherein the first gate portion crosses over the first semiconductor fin, and a second FinFET including a second semiconductor fin, wherein the second gate portion crosses over the second semiconductor fin. A difference between the second length and the first length is at least three Angstroms. A shape of the gate isolation plug can include an oval shape, a square shape, or a shape having a regular central portion and first and second irregular end portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
an elongated gate comprising a first length;
a first elongated dielectric spacer adjacent to a first sidewall of the elongated gate, and a second elongated dielectric spacer adjacent to a second sidewall of the elongated gate;
a gate isolation plug dividing the elongated gate into a first gate portion and a second gate portion, wherein the gate isolation plug completely isolates the first gate portion from the second gate portion, and wherein the gate isolation plug only partially extends into the first and second elongated dielectric spacers;
a first Fin Field-Effect Transistor (FinFET) comprising a first semiconductor fin, wherein the first gate portion crosses over the first semiconductor fin; and
a second FinFET comprising a second semiconductor fin, wherein the second gate portion crosses over the second semiconductor fin.

2. The device of claim 1, wherein the gate isolation plug comprises a second length greater than the first length, and wherein a difference between the second length and the first length is at least three Angstroms.

3. The device of claim 1, wherein a shape of the gate isolation plug comprises an oval shape.

4. The device of claim 1, wherein a shape of the gate isolation plug comprises a square shape.

5. The device of claim 1, wherein a shape of the gate isolation plug comprises a regular central portion and first and second irregular end portions.

6. A device comprising:
a first gate crossing over a first semiconductor fin;
a second gate crossing over a second semiconductor fin;
a first spacer layer in contact with a first sidewall of the first gate and a first sidewall of the second gate, the first spacer layer having a first portion, a second portion, and a third portion interposed between the first portion and the second portion, the first portion being in contact with the first sidewall of the first gate, the second portion being in contact with the first sidewall of the second gate, the third portion having a first sidewall;

a second spacer layer in contact with a second sidewall of the first gate and a second sidewall of the second gate, the second spacer layer having a fourth portion, a fifth portion, and a sixth portion interposed between the fourth portion and the fifth portion, the fourth portion being in contact with the second sidewall of the first gate, the fifth portion being in contact with the second sidewall of the second gate, the sixth portion having a second sidewall; and a gate isolation plug between the first gate and the second gate, wherein the gate isolation plug extends from the first sidewall of the first spacer layer to the second sidewall of the second spacer layer, wherein the gate isolation plug attains a maximum length along a line through a center point of the gate isolation plug and orthogonal to a longitudinal axis of the first and second gates, and wherein the first sidewall of the third portion and the second sidewall of the sixth portion have a concave shape.

7. The device of claim 6, wherein a smallest width of the gate isolation plug interposed between the first gate and the second gate is greater than a largest width of the gate isolation plug interposed between the first portion and the second portion of the first spacer layer, wherein the smallest width and the largest width are measured in a direction parallel to a longitudinal axis of the first gate.

8. The device of claim 6, wherein the first spacer layer and the second spacer layer are different sections of a single continuous layer.

9. The device of claim 6, wherein a first length of the gate isolation plug is greater than a second length of the first gate, wherein the first length and the second length are measured in a direction parallel to a longitudinal axis of the first semiconductor fin.

10. The device of claim 9, wherein a difference between the first length of the gate isolation plug and the second length of the first gate is at least three Angstroms.

11. The device of claim 8, wherein the gate isolation plug comprises a thickness of about 5 to 200 Angstroms.

12. The device of claim 6, wherein the third portion of the first spacer layer comprises a second sidewall opposite from the first sidewall, the first sidewall of the third portion comprising a concave sidewall, wherein the second sidewall of the third portion is linear.

13. The device of claim 6, wherein a smallest width of the gate isolation plug interposed between the first gate and the second gate is less than a largest width of the gate isolation plug interposed between the first portion and the second portion, wherein the smallest width and the largest width are measured in a direction parallel to a longitudinal axis of the first gate.

14. The device of claim 6, wherein a first width of the third portion is less than a second width of the first portion, wherein a third width of the sixth portion is less than a fourth width of the fourth portion, and wherein the first width, the second width, the third width, and the fourth width are measured in a direction parallel to the first semiconductor fin.

15. The device of claim 6, wherein upper surfaces of the gate isolation plug, the first spacer layer, the second spacer layer, the first gate, and the second gate are level.

16. A device comprising:
first and second gates;
a first dielectric spacer in contact with a first sidewall of the first gate and a first sidewall of the second gate;
a second dielectric spacer in contact with a second sidewall of the first gate and a second sidewall of the second gate; and
a gate isolation plug between the first and second gates, wherein a first end portion of the gate isolation plug is in contact with a concave sidewall of the first dielectric spacer, and wherein a second end portion of the gate isolation plug is in contact with a concave sidewall of the second dielectric spacer.

17. The device of claim 16, wherein a difference between a length of the gate isolation plug and a length of either of the first and second gates is at least three Angstroms, wherein the length of the gate isolation plug and the length of the first and second gates are measured orthogonally to a longitudinal axis of the first and second gates.

18. The device of claim 16, wherein the gate isolation plug comprises an oval shape.

19. The device of claim 16, wherein the gate isolation plug extends only partially through the first dielectric spacer and the second dielectric spacer.

20. The device of claim 16, wherein the gate isolation plug comprises a lemon shape.

* * * * *

UNITED STATES PATENT AND TRADEMARK OFFICE
CERTIFICATE OF CORRECTION

| | |
|---|---|
| PATENT NO. | : 11,145,512 B2 |
| APPLICATION NO. | : 16/872814 |
| DATED | : October 12, 2021 |
| INVENTOR(S) | : Hsieh et al. |

It is certified that error appears in the above-identified patent and that said Letters Patent is hereby corrected as shown below:

In the Claims

Claim 11, Column 11, Line 43; delete "The device of claim 8" and insert --The device of claim 6--.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*